United States Patent [19]

Maruyama et al.

[11] Patent Number: 4,965,073
[45] Date of Patent: Oct. 23, 1990

[54] PROCESS FOR PREPARING THE PRINTED-CIRCUIT BOARDS USING A PHOTOSENSITIVE COMPOSITION CONTAINING A REDUCTION TYPE LEICO PIGMENT

[75] Inventors: Tsutomu Maruyama; Kiyotake Fukawa; Atsushi Akiyama; Yoshihiro Kiyomura, all of Hiratsuka, Japan

[73] Assignee: Kansai Paint Co., Ltd., Amagasaki, Japan

[21] Appl. No.: 496,932

[22] Filed: Mar. 21, 1990

[30] Foreign Application Priority Data

Mar. 23, 1989 [JP] Japan ................................. 1-71058

[51] Int. Cl.$^5$ .............................................. G03C 5/00
[52] U.S. Cl. ..................................... 430/292; 430/319
[58] Field of Search ............................. 430/319, 292

[56] References Cited

U.S. PATENT DOCUMENTS

| 4,425,424 | 1/1984 | Altland et al. | 430/292 |
| 4,634,655 | 1/1987 | Holman | 430/292 |
| 4,687,728 | 8/1987 | Folkard et al. | 430/292 |

Primary Examiner—Jack P. Brammer
Attorney, Agent, or Firm—Fisher, Christen & Sabol

[57] ABSTRACT

Disclosed is an improved process for preparing the printed circuit board, which comprises coating a photocurable electrodeposition coating composition on the surface of the copper foil of a copper-clad, laminated plate to form a photo-sensitive resist film thereon, lapping a photographic negative or positive film onto the photo-sensitive resist film, and exposing to an active light, followed by development, the improvement comprising incorporating a colorless or substantially colorless reduction-type leico pigment into the electrodeposition coating composition to form a photo-sensitive resist film containing the leico pigment, and to develop a color in an exposed area of the photo-sensitive resist film by exposing to the active light.

5 Claims, No Drawings

PROCESS FOR PREPARING THE PRINTED-CIRCUIT BOARDS USING A PHOTOSENSITIVE COMPOSITION CONTAINING A REDUCTION TYPE LEICO PIGMENT

BACKGROUND OF THE INVENTION:

(1) Field of the Invention:

This invention relates to a process for preparing a printed-circuit board, and more particularly to an improved process for preparing a printed-circuit board, the improvement comprising coating an electrodeposition coating composition containing a reduction type leico pigment on the surface of the copper foil of a copper-clad laminated plate for use in the printed circuit board (hereinafter referred to a copper-clad laminated plate) to form a photo-sensitive resist film thereon, followed by lapping a photographic negative or positive film onto the photo-sensitive resist film, and exposing to an active light such as laser, ultraviolet light, X-ray, electron beam or the like all over the photo-sensitive film or scanning the active light for drawing along a circuit pattern to develop a color as the circuit pattern is so as to make it possible to greatly reduce a reject rate of the product.

(2) Description of the Prior Art:

The printed-circuit board has conventionally been prepared for a long period of time by a process which comprises forming a photo-sensitive resist film on the surface of a copper foil of the copper-clad laminated plate, exposing the resist film to light through a desired pattern mask, followed by applying a developing treatment to obtain a resist film pattern, and applying etching onto the surface of an exposed copper foil to obtain a desired circuit pattern.

The conventional method of forming the photo-sensitive resist film on the copper foil on the surface of the copper-clad laminated plate includes a method of coating a liquid resist material by use of the conventional coating process such as dipping, roller coating, centrifugal coating and the like, a method of laminating a film-shaped photo-sensitive film called the dry film, for example, Riston film marketed by Du Pont de Nemours & Co. by use of the exclusive sticker, and the like. Recently, however, in place of the above conventional methods, there has been proposed a method of forming the photo-sensitive resist film which comprises coating a photo-curable electrodeposition coating composition (Japanese patent application Laid-Open No. 198795/86, etc.).

The method of forming the photo-sensitive resist film by coating the photo-curable electrodeposition coating composition on the copper foil on the surface of the copper-clad laminated plate has such advantages as to be capable of uniformly coating without loss of the starting material and of being incorporated into an automatic line.

However, the resist film formed after exposing the photosensitive resist film to light shows no change in appearance between before and after exposure to light and it is impossible for the resist film to distinguish an exposed area from an unexposed area, resulting in causing such defectives that exposure to light is doubly carried out, that the photo-sensitive resist film may be considered by mistake to have been exposed to light in spite of not having actually been exposed to light and may be subjected to the following development without exposing to light, resulting in forming no pattern resist film, and the like.

On the other hand, incorporation of a coloring matter such as dye or pigment into the electrodeposition coating composition results in reducing permeability to light through the film, in greatly reducing the productivity of the printed circuit board, and in causing such a disadvantage that the energy necessary to exposure to light must be increased in order to increase the above productivity.

SUMMARY OF THE INVENTION:

It is an object of the present invention to provide a process for preparing the printed-circuit board, which is capable of greatly reducing a reject rate of the printed-circuit board as the product without impairing the photosensitivity of the photo-sensitive resist film and without reducing productivity by a very simple means, and of very easily protecting the copper in the through-holes.

The present invention provides an improved process for preparing the printed circuit board, which comprises coating a photo-curable electrodeposition coating composition on the surface of the copper foil of a copper-clad, laminated plate to form a photo-sensitive resist film thereon, lapping a photographic negative or positive film onto the photo-sensitive resist film, and exposing to an active light, followed by development, the improvement comprising incorporating a colorless or substantially colorless reduction-type leico pigment into the electrodeposition coating composition to form a photo-sensitive resist film containing the leico pigment, and to develop a color in an exposed area of the photo-sensitive resist film by exposing to the active light.

DETAILED DESCRIPTION OF THE INVENTION:

The photo-curable electrodeposition coating composition used for the formation of the photo-sensitive resist film in the present invention may be the anionic or cationic electrodeposition coating composition. The photo-curable anionic electrodeposition coating composition is composed of the conventional photo-curable composition, which is prepared by formulating (i) a water soluble or water dispersible, polymerizable unsaturated resin having an acid value of 20 to 300, particularly 40 to 110, an unsaturation equivalent of about 150 to about 3,000 and a number average molecular weight of about 300 or more, particularly 1,000 to 30,000, and having an ethylenically unsaturated bond polymerizable by an actinic ray, and (ii) a water-insoluble photopolymerization initiator.

Examples of the basic resin constituting a basic skeleton of the polymerizable unsaturated resin include acrylic resin, urethane resin, epoxy resin, polyester resin, polyether resin, alkyd resin, polyvinyl chloride, fluorocarbon resin, silicone resin, polyvinyl acetate, polyvinyl alcohol, and the like.

The typical examples of the polymerizable unsaturated resin may include (1) one containing, as the major component, a polymerizable unsaturated resin prepared by addition of a reaction product of a compound having a polymerizable unsaturated bond and hydroxyl group in one molecule with a diisocyanate compound to a high acid value acrylic resin having hydroxyl group on the skeleton, or a mixture of the above polymerizable unsaturated resin with an ethylenically unsaturated compound having one or more of a polymerizable unsaturated bond in one molecule; (2) one containing, as the major component, a mixture of a polymerizable unsaturated resin prepared by addition of α, β-ethylenically unsaturated dibasic acid or an anhydride thereof to an unsaturated bond in the aliphatic acid chain of an esterification product between an epoxy resin having epoxy group and unsaturated fatty acid with an ethylenically unsaturated compound having one or more of a polymerizable unsaturated bond in one molecule; (3) one containing, as the major component, a mixture of a polymerizable unsaturated resin comprising an unsaturated fatty acid modified high acid value alkyd resin with an ethylenically unsaturated compound having one or more of the polymerizable unsaturated bond in one molecule; (4) one containing, as the major component, a mixture of a polymerizable unsaturated resin comprising a maleic oil with an ethylenically unsaturated compound having one or more of a polymerizable unsaturated bond in one molecule; and (5) one containing, as the major component, a polymerizable unsaturated resin prepared by addition of a compound having a polymerizable unsaturated bond and glycidyl group in one molecule to a high acid value acrylic resin or a mixture of the above polymerizable unsaturated resin with an ethylenically unsaturated compound having one or more of a polymerizable unsaturated bond in one molecule.

Of the above polymerizable unsaturated resins, the polymerizable unsaturated resin in the above (5) is preferred.

The film-forming resin constituting the photographic negative type photo-curable cationic electrodeposition coating composition used in the present invention is the conventional resin containing an ethylenically unsaturated group such as acryloyl group, methacryloyl group or the like and amino group. As to the amino group, tertiary amino group is preferred, because primary and secondary amino groups are easily subjected to addition reaction with the ethylenically unsaturated group and have poor storage properties.

Examples of the resin containing the ethylenically unsaturated group and amino group include (1) a resin prepared by addition of primary or secondary amine to the expoxy compound followed by addition of an isocyanate compound containing the ethylenically unsaturated group to hydroxyl group; (2) a resin prepared by addition of a compound containing the ethylenically unsaturated group and carboxy group to the epoxy group of a resin containing epoxy group and tertiary amino group; and (3) a resin prepared by addition of primary amine to a monoepoxy compound for secondary amination, followed by addition of a diepoxy compound or a polyepoxy compound in such an amount that a ratio of a number of equivalents between the secondary amine and epoxy group may be 1 to 2 or higher, and by the addition of the compound containing the ethylenically unsaturated group and carboxy group to the remaining epoxy group, or prepared by addition of the isocyanate compound containing the ethylenically unsaturated group to hydroxyl group.

The cationic unsaturated resin thus obtained is made water-dispersible or water-soluble by neutralization of the amino group contained in the resin skeleton.

Examples of the neutralizing agent include acetic acid, propionic acid, lactic acid, hydrochloric acid, sulfuric acid, phosphoric acid, formic acid, acrylic acid, methacrylic acid, crotonic acid and the like.

The cationic electrodeposition coating composition is used at a pH in the range of 5–7.

Examples of the water-insoluble photopolymerization initiator incorporated in the photographic negative type photo-curable electrodeposition coating composition may include benzoin, benzoin methyl ether, benzoin ethyl ether, benzyl, diphenyl disulfide, tetramethylthiuram monosulfide, Eosine, Thionine, diacetyl, Michler's ketone, anthraquinone, α-hydroxyisobutylphenone, p-isopropyl-α-hydroxyisobutylphenone, α,α'-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)phenyl]-2-morpholinopropene, thioxanthone, benzophenone, and the like. The above photopolymerization initiator may be used in an amount of 0.1 to 10 parts by weight per 100 parts by weight of the resin component (as solids).

The photographic positive type electrodeposition coating composition used for forming the photographic positive type resist film in the present invention may include the conventionally known ones containing, as the major component, a water-soluble or water-dispersible resin having quinonediazido group, and more specifically ones containing, as the major component, a resin containing benzoquinonediazido unit or naphthoquinonediazido unit, and may be of the anionic or cationic type (see, for example, Japanese patent application Laid-Open Nos. 207139/85, 206293/86 and 6070/88, Japanese patent application Nos. 157841/87, 157842/87, 245840/87 and 279288/87, and the like).

The resin for use in the anionic electrodeposition coating composition to be used for forming a photographic positive type resist film in the present invention may include, for example, (i) a resin prepared by copolymerizing an unsaturated monomer obtained by the esterification reaction between the hydroxyl group contained in an unsaturated monomer and the acid group contained in naphthoquinonediazidosulfonic acid with other unsaturated monomer; (ii) a resin for use in the photographic positive type photo-sensitive anionic electrodeposition coating composition, which contains, as the major component, a vinyl anionic resin obtained by copolymerizing (a) an unsaturated monomer obtained by reacting an unsaturated monomer having one polymerizable unsaturated group and one secondary amino group in one molecule with a halide of benzoquinonediazidosulfonic acid and/or naphthoquinonediazidosulfonic acid, (b) at least one unsaturated monomer selected from a carboxyl group-containing unsaturated monomer, a phosphate group-containing unsaturated monomer and sulfonate group-containing unsaturated group, and (c), when needed, a monoethylenically unsaturated monomer; and the like.

The resin for use in the cationic electrodeposition coating composition to be used for forming the photographic positive type resist film in the present invention may include, for example, (i) a vinyl cationic resin obtained by copolymerizing (a) an unsaturated monomer prepared by reacting an unsaturated monomer having one polymerizable unsaturated group and one secondary amino group in one molecule with a halide of benzoquinonediazidosulfonic acid and/or naphthoquinonediazidosulfonic acid, (b) an amino group-containing unsaturated monomer, and (c), when needed, a monoethylenically unsaturated monomer; and (ii) a vinyl cationic resin prepared by reacting an amine compound with a copolymer obtained by copolymerizing (a) an unsaturated monomer obtained by reacting the secondary amino group-containing unsaturated monomer with the quinonediazidosulfonic acid halide, (d) a glycidyl group-containing unsaturated monomer, and (e), when needed, a monoethylenically unsaturated monomer.

The photographic positive type anionic electrodeposition coating composition may be prepared by neutralizing the above vinyl resins containing the quinonediazido group and acid group with an amine or alkali compound to make water-dispersible or water-soluble.

The photographic positive type cationic electrodeposition coating composition is prepared by neutralizing the amino group of the above vinyl resin with an organic or inorganic acid to make water-dispersible or water-soluble.

The leico pigment used in the present invention means a reduction type pigment, is colorless or light-colored, and has good permeability to light. The above leico pigment is activated by the transmitted and absorbed light thereinto to develop a color.

The above leico pigment is represented by the general formula (I):

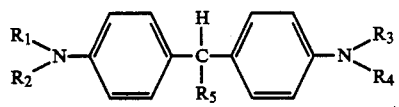

where $R_1$, $R_2$, and $R_3$ and $R_4$ represent hydrogen atom or an alkyl group having 1 to 4 carbon atoms respectively, and $R_5$ represents the following groups:

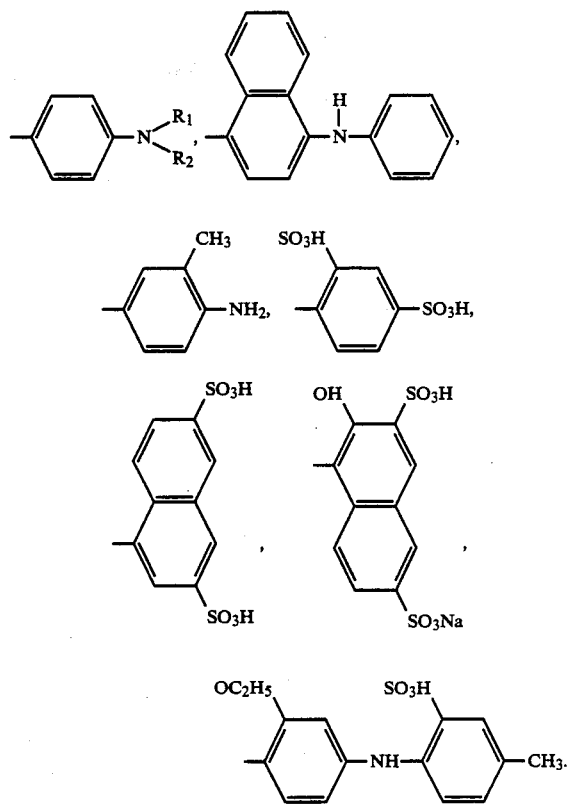

The above leico pigment is dissolved, to be convenient, in a solvent such as methylene chloride, dimethyl formamide, tetrahydrofuran, acetone, methyl ethyl ketone, tetrachloroethane and the like.

Examples of the leico pigment used in the present invention may include Leico Crystal Violet, Naphthalene Green V, Fuchsine, Patent Blue V and the like. The above leico pigment is used in an amount of 0.05 to 5% by weight based on an amount of the resin for use in the photographic negative type anionic electrodeposition coating composition, the photographic negative type cationic electrodeposition coating composition, the photographic positive type anionic electrodeposition coating composition, or in the photographic positive type cationic electrodeposition coating composition, resulting in that exposure to light makes it possible to distinguish an unexposed area from an exposed area. When the above amount of the leico pigment is less than 0.05% by weight, it is difficult to distinguish the unexposed area from the exposed area. When the above amount of the leico pigment is more than 5% by weight, stability of the electrodeposition coating composition is reduced and cost is increased.

The above electrodeposition coating composition is subjected to the electrodeposition coating under the conditions of a bath concentration of 3-30% by weight, preferably 5-20% by weight, and a bath temperature of 15°-40° C., preferably 15°-30° C.

The above electrodeposition coating composition may contain a hydrophilic solvent such as alcohol, ether or the like, and a hydrophobic solvent, for example, petroleum solvent such as toluene, xylene or the like, ketone solvent and ester solvent in order to control electrodeposition characteristics, finish surface texture, pinhole, etc.

The copper-clad laminated plate is dipped into the above electrodeposition coating bath to apply a direct current under 20 to 400 V for coating. The copper-clad laminated plate is used as an anode for the anionic electrodeposition coating, and as a cathode for the cationic one. The above direct current is applied normally for 15 seconds to 5 minutes. The completion of the above electrodeposition coating is followed by hydro-extracting, air blow, etc. to be dried at a temperature in the range of 50° C. to 130° C. In this connection, the above drying may be carried out in such ranges of temperature and time that heating causes no reaction of the resist to take place. The coated film thickness is 5 to 100 μm, preferably 10 to 60 μm.

Examples of the active light used in exposing to light may include ultraviolet light, visible light, laser beam, X-ray, electron beam, ion beam and the like.

Examples of the ultraviolet light-generating apparatus may include high pressure mercury lamp, ultra-high pressure mercury lamp, metal halide lamp, xenon lamp, arc lamp, chemical lamp and the like.

Examples of the above laser may include carbon dioxide gas laser, YAG laser, argon laser, excimer laser, mercury halide excimer laser, rare gas excimer laser and the like.

The above visible light, active light and radiation may be irradiated under an atmosphere of the atmospheric pressure or reduced vacuum pressure, and may be irradiated in an atmosphere of an inert gas such as nitrogen gas, carbon dioxide gas, argon gas or the like under the atmospheric or reduced pressure.

It is a common practice to lap a mask onto a photosensitive resist film, followed by irradiating an actinic ray through the mask to form a pattern circuit. However, it is easy too, to draw a pattern by directly scanning the actinic ray. According to the present invention, after the completion of exposing to light as above, the exposed area is easily distinguishable from the unexposed area by the naked eye. After the completion of electrodeposition coating, drying and exposing to light as above, the copper-clad laminated plate is subjected to a developing treatment.

The developing treatment in the case of the anionic electrodeposition coating is carried out by spraying an aqueous weak alkali or by dipping into the aqueous weak alkali to wash away an uncured or reacted area. The aqueous weak alkali, which is capable of neutralizing a free carboxylic acid contained in the film to make water-soluble, may include, for example, an aqueous caustic soda, sodium carbonate, caustic potash, ammonia, amine, sodium silicate and the like. In the case where the photographic negative type is used, the uncured area is washed away, and in the case where the photographic positive type is used, the exposed area is washed away.

In the case where the cationic electrodeposition coating is carried out, the developing treatment is carried out by spraying an aqueous weak acid or by dipping into the aqueous weak acid to wash away an uncured area for the photographic negative type or an exposed, reacted area for the photographic positive type. The aqueous weak acid, which is capable of neutralizing a free amino group in the film to make water-soluble, may include, for example, hydrochloric acid, sulfuric acid, phosphoric acid, acetic acid, silicic acid, formic acid, lactic acid and the like. It is also possible to carry out the above developing treatment by use of a solvent.

After the completion of the developing treatment, a non-circuit area deposited on the plate and composed of copper foil, aluminum foil, etc. is removed by use of ferric chloride, cupric chloride, etc. according to the conventional etching treatment. Thereafter, the cured film on the circuit pattern is removed by use of a strong alkali such as caustic soda or by use of a solvent such as methylene chloride to form a printed circuit on the plate.

According to the present invention, a photo-sensitive resist film is formed on the copper foil of the copper foil-clad laminated plate by the anionic or cationic electrodeposition coating, and the photo-sensitive resist film is, when needed, warmed or heated, and is then exposed to light by irradiating an active light, when needed, through a pattern mask lapped thereon. After the completion of exposing to light, the exposed area can be distinguished without fail from the unexposed area without carrying out the developing treatment.

Next, the developing treatment is carried out by use of a weak alkali or a weak acid, followed by the etching treatment to obtain a printed circuit. The application of the electrodeposition coating makes it possible even for an object having complicated shapes to form a uniform film. Generally, the laminated circuit has through-holes, and the application of the electrodeposition coating to the laminated circuit having through-holes makes it possible to very easily protect the copper in the through-holes.

The present invention will be explained more in detail by the following Examples.

EXAMPLE 1

A mixture of 40 parts by weight of methyl methacrylate, 40 parts by weight of butyl acrylate, 20 parts by weight of acrylic acid and 2 parts by weight of azobisisobutyronitrile is dropped over 3 hours into 90 parts by weight of propylene glycol monomethyl ether as a hydrophilic solvent at 110° C. under an atmosphere of nitrogen gas. The completion of the above dropping is followed by one hour's maturing, and a mixture of one part by weight of azobisdimethylvaleronitrile and 10 parts by weight of propylene glycol monomethyl ether is dropped over one hour, followed by 5 hours' maturing to obtain a solution of a high acid value acrylic resin having an acid value of 155. Thereafter, to the above solution are added 24 parts by weight of glycidyl methacrylate, 0.12 part by weight of hydroquinone and 0.6 part by weight of tetraethylammonium bromide, followed by reacting for 5 hours at 110° C. blowing air thereinto to obtain a solution (1) of an unsaturated resin having an acid value of about 50, a degree of unsaturation of 1.35 moles/kg, a Tg of 20° C. and a number average molecular weight of about 20,000.

To 227 parts by weight of the above unsaturated resin solution (1) is added 6.7 parts by weight of triethylamine to be sufficiently neutralized, followed by adding 6 parts by weight of α-hydroxyisobutylphenone as a photopolymerization initiator and further adding a 5% Leico Crystal Violet tetrahydrofuran solution in an amount of 6% by weight relative to the resin or the above pigment in an amount of 0.3% by weight relative to the resin to be mixed, and by adding deionized water in such an amount as to obtain an electrodeposition coating bath (pH: 7.0) having a solids content of 14% by weight. The electrodeposition coating is carried out by use of the above electrodeposition coating bath under such conditions that a copper-clad laminated plate $100 \times 100 \times 1.6$ mm) for use in the printed circuit board and having through-holes is used as an anode, that the bath temperature is 25° C., and that a direct current is applied for 3 minutes under a current density of 50 mA/dm$^2$. The coated film is washed with water and dried at 80° C. for 10 minutes to obtain a non-sticky, smooth photo-sensitive film having a thickness of 18 μm. Thereafter, a pattern mask film is lapped on the photo-sensitive resist film to be vacuumed and exposed to light at a dose of 300 mj/cm$^2$ by use of an ultra-high pressure mercury lamp.

The pattern mask film is then removed so that an unexposed area may be distinguished from an exposed area by the naked eye with the result that the former can be satisfactorily distinguished from the latter by the naked eye. Next, the unexposed area is washed away with a 1% sodium carbonate solution to carry out the developing treatment, followed by washing with water, etching away a copper foil with ferric chloride, and by removing a cured film in the exposed area with a 5% caustic soda to obtain a printed circuit board having a fine and sharp pattern. A circuit in the interior of through-holes is satisfactorily formed.

EXAMPLE 2

A mixture of 60 parts by weight of styrene, 10 parts by weight of methyl acrylate, 30 parts by weight of acrylic acid and 3 parts by weight of azobisisobutylonitrile is dropped over 3 hours into 90 parts by weight of cellosolve kept at 120° C. under an atmosphere of nitrogen gas. The completion of the above dropping is followed by one hour's maturing, and a mixture of one part by weight of azobisdimethylvaleronitrile and 10 parts by weight of cellosolve is dropped over one hour, followed by 5 hours' maturing to obtain a solution of a high acid value acrylic resin having an acid value of 233. Thereafter, to the above solution are added 35 parts by weight of glycidyl methacrylate, 0.13 part by weight of hydroquinone and 0.6 part by weight of etetraethylammonium bromide, followed by reacting for 5 hours at 110° C. blowing air thereinto to obtain a solution (2) of an unsaturated resin having an acid value of about 70, a degree of unsaturation of 1.83 moles/kg, a Tg of 45° C. and a number average molecular weight of about 15,000.

To 240 parts by weight of the unsaturated resin solution is added 8.5 parts by weight of triethylamine to be sufficiently neutralized. Thereafter, 40 parts by weight of isobutyl alcohol and 7 parts by weight of benzoin ethyl ether as the photopolymerization initiator are added, followed by adding a 5% Leico Crystal Violet dimethylformamide solution in an amount of 15% by weight relative to the resin and by adding deionized water in such an amount as to obtain an electrodeposition coating bath (pH: 7.3) having a solids content of 10% by weight. An electrodeposition coating is carried out under such conditions that a copper-clad laminated plate, the throughholes of which are plated, is used as an anode, and that a direct current under 100 V is applied for 2 minutes at a bath temperature of 30° C. The above electrodeposition coating is followed by washing with water, hydro-extracting, drying and irradiating an ultraviolet light generated from a high pressure mercury lamp through a pattern mask film at a dose of 200 mj/cm$^2$.

The exposed area can sufficiently be distinguished from the unexposed area by the naked eye with good results.

A 1% sodium carbonate solution is sprayed onto the resulting plate for developing, followed by etching with cupric chloride, and removing the resist film with caustic soda to obtain an intended printed circuit board.

EXAMPLE 3

Methyl methacrylate, butyl acrylate and glycidyl methacrylate are copolymerized to obtain a glycidyl group-containing acrylic resin. The above polymer is reacted with diethanolamine to obtain a cationic resin having an amine value of 40. An acrylic acid is added and reacted with a residual glycidyl group of the above cationic resin to obtain an unsaturated cationic resin varnish having a degree of unsaturation of 0.8 mole/kg.

The above resin varnish is neutralized with acetic acid, followed by adding 5% by weight of α-hydroxyisobutylphenone as a photopolymerization initiator based on the weight of the resin, 5% by weight of butyl alcohol based on the weight of the resin, 5% by weight of a 3% Naphthalene Green V dimethylformamide solution based on the weight of the resin, and by adding deionized water in such an amount as to obtain an electrodeposition coating bath (pH: 6.0) having a solids content of 17%.

An electrodeposition coating is carried out by using an aluminum plate as a cathode so as to form a film having a thickness of 13 μm, followed by hydro-extracting and drying at 80° C. for 10 minutes, and by irradiating through a pattern mask film at a dose of 100 mj/cm$^2$ by use of a metal halide lamp.

The exposed area can sufficiently be distinguished from the unexposed area by the naked eye with good results. The resulting plate is subjected to developing treatment by use of lactic acid, followed by etching with ferric chloride and removing the resist film by use of methylene chloride to obtain an intended printed circuit pattern.

EXAMPLE 4

Methyl methacrylate, ethyl acrylate and glycidyl methacrylate are copolymerized according to the conventional process to obtain a glycidyl group-containing acrylic resin. The resulting polymer is reacted with hydroxyethyl acrylate to obtain an unsaturated resin having a degree of unsaturation of 1.2 moles/kg.

The above unsaturated resin is reacted with diethanolamine to obtain a cationic unsaturated resin varnish having an amine value of 45.

The above resin varnish is neutralized with acetic acid, followed by adding 3% by weight of diethyl thioxanthone as a photopolymerization initiator based on the weight of the resin, 3% by weight of isobutyl alcohol based on the weight of the resin, 2% by weight of methyl ethyl ketone based on the weight of the resin, 10% by weight of a 8% Fuchsine methylene chloride solution based on the weight of the resin to be mixed, and by adding deionized water in such an amount as to obtain a coloring electrodeposition coating bath (pH: 6.5) having a solids contents of 15%.

An electrodeposition coating is carried out for two and half minutes under such conditions that a copper-clad laminated plate is connected with a cathode, and that a current density is controlled so as to obtain a film thickness of 16 μm. The above electrodeposition coating is followed by washing with water, hydro-extracting and drying, and by irradiating an excimer laser (XeCl) at a dose of 100 mj/cm$^2$ to form a pattern. The exposed area can sufficiently be distinguished from the unexposed area by the naked eye with good results. A developing treatment is carried out with acetic acid and etching treatment is carried out with alkali, resulting in obtaining an intended circuit pattern.

EXAMPLE 5

Into a four-necked flask are introduced 210 parts by weight of tert-butylaminoethyl methacrylate, 90 parts by weight of dioxane and 130 parts by weight of triethylamine, followed by heating up to 40° C., dropping a solution prepared by dissolving 270 parts by weight of orthonaphthoquinonediazidosulfonic chloride in 1080 parts by weight of dioxane over one hour with agitation, and by keeping at 40° C. for 3 hours.

The resulting solution is introduced into deionized water to precipitate a reaction product. The precipitate is placed in a vacuum dryer to remove solvent and to obtain a naphthoquinonediazido group-containing unsaturated monomer (3).

Into a four-necked flask is introduced 600 parts by weight of ethylene glycol monoethyl ether, followed by heating up to 60° C., dropping over 3 hours a mixed solution of 350 parts by weight of the unsaturated monomer (3), 250 parts by weight of methyl methacrylate, 250 parts by weight of n-butyl acrylate, 120 parts by weight of N,N-dimethylaminoethyl acrylate and 50 parts by weight of azobisdimethylvaleronitrile, keeping for one hour, dropping over one hour a mixed solution of 70 parts by weight of ethylene glycol monoethyl ether and 5 parts by weight of azobisdimethylvaleronitrile, and by further keeping for two hours to obtain a solution of a photographic positive type photo-sensitive resin having an amine value of 48 and a number average molecular weight of 10,000. To the above photo-sensitive resin solution is added 25 parts by weight of acetic acid to be sufficiently neutralized, followed by adding 10% by weight of a 5% Leico Crystal Violet tetrahydrofuran solution based on the weight of the resin to be mixed, and by adding deionized water in such an amount as to obtain an electrodeposition coating bath (pH: 6.3) having a solids content of 10%. An electrodeposition coating is carried out under such conditions that a copper-clad laminated plate having through-holes is used as a cathode, and that a direct current under 120 V is applied for 3 minutes at a bath temperature of 25° C. The completion of the electrodeposition coating is followed by drying at 50° C. for 5 minutes to obtain a smooth photo-sensitive resist film having a thickness of 5 μm.

The photo-sensitive resist film is subjected to irradiation at a dose of 150 mj/cm$^2$ through a photographic positive type mask film by use of an ultra-high pressure mercury lamp. The exposed area can sufficiently be distinguished from the unexposed area by the naked eye with good results.

A developing treatment is carried out with a 0.5% sodium carbonate, and an etching treatment is carried out with cupric chloride, resulting in obtaining a satisfactory pattern circuit.

EXAMPLE 6

Into a four-necked flask is introduced 400 parts by weight of methylisobutyl ketone, followed by heating up to 80° C. with agitaion, dropping over 3 hours a mixed solution of 240 parts by weight of tert-butylaminoethyl methacrylate, 140 parts by weight of N,N-dimethylaminoethyl methacrylate, 310 parts by weight of butyl acrylate and 35 parts by weight of azobisisobutylonitrile, keeping for one hour, dropping over one hour a mixed solution of 80 parts by weight of methylisobutyl ketone and 10 parts by weight of azobisdimethylvaleronitrile, keeping for two hours, cooling down to 40° C., dropping over 2 hours a mixed solution of 270 parts by weight of orthonaphthoquinonediazidosulfonic chloride and 630 parts by weight of dioxane, and keeping 2 hours to obtain a solution (4) of a photographic positive type photo-sensitive resin having an amine value of 52 and a number average molecular weight of 8,000.

To the photo-sensitive resin solution (4) are added 25 parts by weight of acetic acid and 7% by weight of a 3% Patent Blue V dimethylformamide solution based on the weight of the resin to be sufficiently neutralized, followed by adding deionized water in such an amount as to obtain an electrodeposition coating bath (pH: 6.2) having a solids content of 15%.

An electrodeposition coating is carried out under such conditions that a copper-clad laminated plate is used as a cathode, and that a bath temperature is kept at 30° C. and a current density is controlled so as to obtain a film thickness of 8 μm. The completion of the electrodeposition coating is followed by washing with water, hydro-extracting and drying, and by irradiating an ultraviolet light onto a resulting film at a dose of 300 mj/cm$^2$ through a photographic positive type pattern mask film for exposing to light. The exposed area can sufficiently be distinguished from the exposed area by the naked eye with good results.

A developing treatment is carried out with a 1% sodium metasilicate, and a resulting resist film is removed with ar alkali, resulting in obtaining a good pattern circuit.

EXAMPLE 7

Into a four-necked flask are introduced 210 parts by weight of tert-butylaminoethyl methacrylate, 90 parts by weight of dioxane and 130 parts by weight of triethylamine, followed by heating up to 40° C., dropping with agitation over one hour a solution prepared by dissolving 270 parts by weight of orthonaphthoquinonediazidosulfonic chloride in 1080 parts by weight of dioxane, and by keeping at 40° C. for 3 hours.

A resulting solution is introduced into deionized water to precipitate a reaction product. The precipitate is placed in a vacuum dryer to remove the solvent and to obtain an orthonaphthoquinonediazido group-containing unsaturated monomer (5).

Into a four-necked flask is introduced 600 parts by weight of isopropyl alcohol, followed by heating up to 60° C. with agitation, dropping over 3 hours a mixed solution of 350 parts by weight of the unsaturated monomer (5), 300 parts by weight of methyl methacrylate, 260 parts by weight of n-butyl acrylate, 60 parts by weight of acrylic acid and 50 parts by weight of azobisdimethylvaleronitrile, keeping for one hour, dropping over one hour a mixed solution of 70 parts by weight of isopropyl alcohol and 5 parts by weight of azobisdimethylvaleronitrile, and further keeping for 2 hours to obtain a solution of a photographic positive type photo-sensitive resin having an acid value of 48 and a number average molecular weight of 10,000.

To the above photo-sensitive resin solution is added 40 parts by weight of triethylamine to be sufficiently neutralized, adding 15% by weight of a 5% Leico Crystal Violet tetrahydrofuran solution based on the weight of the resin to be mixed and thoroughly stirred, and by adding deionized water in such an amount as to obtain an electrodeposition coating bath (pH: 7.2) having a solids content of 15%. An electrodeposition coating is carried out under such conditions that the copper-clad laminated plate is used as an anode, and that the current and voltage are controlled so as to obtain a film thickness of 10 μm.

The completion of the electrodeposition coating is followed by washing with water, hydro-extracting and drying, and by exposing to light through a photographic positive type pattern mask film at a dose of 200 mj/cm$^2$ by use of an ultra-high pressure mercury lamp. The exposed area is sufficiently distinguished from the unexposed area.

A developing treatment is carried out with a 5% sodium carbonate solution and an etching treatment is carried out with ferric chloride, and the unexposed area is removed with ethylene glycol monoethyl ether.

As the result, an intended sharp printed circuit pattern is obtained.

EXAMPLE 8

Into a four-necked flask is introduced 400 parts by weight of methylisobutyl ketone, followed by heating up to 80° C. with agitation, dropping over 3 hours a mixed solution of 240 parts by weight of tert-butylaminoethyl methacrylate, 400 parts by weight of methyl acrylate, 50 parts by weight of acrylic acid and 35 parts by weight of azobisisobutylonitrile, keeping for one hour, dropping over one hour a mixed solution of 80 parts by weight of methylisobutyl ketone and 10 parts by weight of azobisdimethylvaleronitrile, keeping for 2 hours, cooling down to 40° C., dropping over 2 hours a mixed solution of 270 parts by weight of orthonaphthoquinonediazidosulfonic chloride and 630 parts by wight of dioxane, and by keeping for 2 hours to obtain a solution of a photographic positive type photo-sensitive resin having an acid value of 42 and a number average molecular weight of 8000.

Next, to the above photo-sensitive resin solution is added 8% by weight of a 5% Napthalene Green V tetrahydrofuran solution based on the weight of the resin to be mixed and stirred, adding 200 parts by weight of ethylene glycol monomethyl ether and 60 parts by weight of dimethyl ethanol amine to be sufficiently neutralized, and by adding deionized water in such an amount as to obtain an electrodeposition coating bath (pH: 7.1) having a solids content of 15%.

An electrodeposition coating is carried out under such conditions that the copper-clad laminated plate is used as an anode, and that a current and voltage are controlled so as to obtain a film thickness of 8 μm. The completion of the above electrodeposition coating is followed by washing with water, hydro-extracting and drying, and by irradiating ultraviolet light from a high pressure mercury lamp at a dose of 300 mj/cm$^2$ through a photographic positive type pattern mask film with the results that the unexposed area is sufficiently distinguished from the exposed area. Further, a developing treatment is carried out with a 0.5 % acetic acid solution and an etching treatment is carried out with cupric chloride, and a resulting resist film is then removed with acetone to obtain an intended sharp printed circuit pattern.

What is claimed is:

1. An improved process for preparing the printed circuit board, which comprises coating a photo-curable electrodeposition coating composition on the surface of the copper foil of a copper-clad, laminated plate to form a photo-sensitive resist film thereon, lapping a photographic negative or positive film onto the photo-sensitive resist film, and exposing to an active light, followed by development, the improvement comprising incorporating a colorless or substantially colorless reduction-type leico pigment into the electrodeposition coating composition to form a photo-sensitive resist film containing the leico pigment, and to develop a color in an exposed area of the photo-sensitive resist film by exposing to the active light.

2. An improved process as claimed in claim 1, wherein the photo-curable electrodeposition coating composition is selected from a photographic negative type anionic electrodeposition coating composition, a photographic negative type cationic electrodeposition coating composition, a photographic positive type anionic electrodeposition coating composition and a photographic positive type cationic electrodeposition coating composition.

3. An improved process as claimed in claim 1, wherein the leico pigment is represented by the following general formula (I):

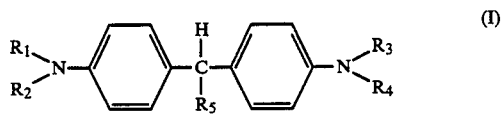

where $R_1$, $R_2$, $R_3$ and $R_4$ represent hydrogen atom or an alkyl group having 1 to 4 carbon atoms respectively, and $R_5$ represents the following groups:

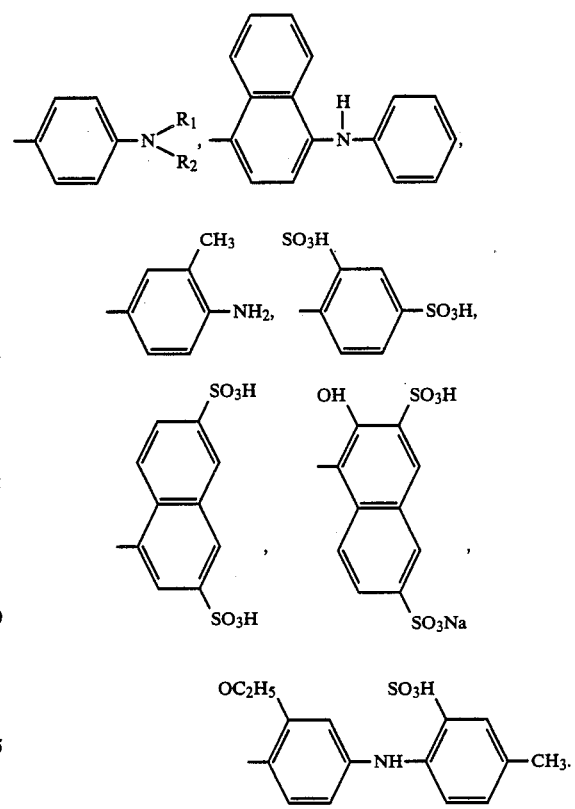

4. An improved process as claimed in claim 1, wherein the leico pigment is selected from Leico Crystal Violet, Naphthalene Green V. Fuchsine, and Patent Blue V.

5. An improved process as claimed in claim 1, wherein the leico pigment is used in an amount of 0.05 to 5% by weight based on an amount of a resin for use in the photo-curable electrodeposition coating composition.

* * * * *